(12) United States Patent
Kim et al.

(10) Patent No.: US 8,357,483 B2
(45) Date of Patent: Jan. 22, 2013

(54) PHOTOSENSITIVE RESIN COMPOSITION COMPRISING A POLYMER PREPARED BY USING MACROMONOMER AS ALKALI SOLUBLE RESIN

(75) Inventors: Han-Soo Kim, Daejeon (KR); Min-Young Lim, Sungnam-si (KR); Yoon-Hee Heo, Daejeon (KR); Ji-Heum Yoo, Daejeon (KR); Sung-Hyun Kim, Daejeon (KR); Kwang-Han Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 596 days.

(21) Appl. No.: 12/450,661

(22) PCT Filed: Apr. 11, 2008

(86) PCT No.: PCT/KR2008/002055
§ 371 (c)(1),
(2), (4) Date: Oct. 5, 2009

(87) PCT Pub. No.: WO2008/127036
PCT Pub. Date: Oct. 23, 2008

(65) Prior Publication Data
US 2010/0081089 A1    Apr. 1, 2010

(30) Foreign Application Priority Data
Apr. 11, 2007  (KR) .................. 10-2007-0035389

(51) Int. Cl.
*G03F 7/033* (2006.01)
*G03F 7/032* (2006.01)
*G03F 7/037* (2006.01)
*C08F 224/00* (2006.01)

(52) U.S. Cl. ............. 430/281.1; 430/910; 430/909; 430/905; 430/907; 430/7; 526/263; 526/259; 526/260; 526/262; 526/232.5; 526/219.6; 526/218.1; 526/219; 526/232.1; 526/227; 526/273; 526/271

(58) Field of Classification Search .................. None
See application file for complete search history.

(56) References Cited

U.S. PATENT DOCUMENTS

| 5,061,602 | A  | * | 10/1991 | Koch et al. ............ 430/281.1 |
| 2003/0232259 | A1 | | 12/2003 | Araki |
| 2005/0112501 | A1 | | 5/2005 | Ikegami et al. |
| 2006/0046193 | A1 | | 3/2006 | Shimada et al. |

FOREIGN PATENT DOCUMENTS

| JP | 60-133007 | 7/1985 |
| JP | 07-028239 | 1/1995 |
| JP | 2000-327728 | 1/2000 |
| JP | 2002-336672 | 11/2002 |
| JP | 2003-128966 | 5/2003 |
| JP | 2003-241374 | 8/2003 |
| JP | 2005-182004 | 7/2005 |
| KR | 10-2001-0111360 | 12/2001 |
| KR | 10-2006-0035380 | 4/2006 |
| WO | WO 2006/046733 | 5/2006 |

OTHER PUBLICATIONS

Kasakura et al, Abstract of JP 02-230151 A published Sep. 12, 1990,t form Chemical abstracts Accession No. 1991:237681, obtained from SciFinder database, 2 pages.*

* cited by examiner

*Primary Examiner* — Cynthia Hamilton
(74) *Attorney, Agent, or Firm* — McKenna Long & Aldridge LLP

(57) ABSTRACT

The present invention relates to a photosensitive resin composition that includes a polymer prepared by using a macromonomer as an alkali soluble resin. The photosensitive resin composition is used for various types of purposes such as a photoresist for preparing a color filter, an overcoat photoresist, a column spacer, and an insulating material having a light blocking property, and improves physical properties such as residue or not, chemical resistance, and heat resistance of the photoresist.

12 Claims, No Drawings

PHOTOSENSITIVE RESIN COMPOSITION COMPRISING A POLYMER PREPARED BY USING MACROMONOMER AS ALKALI SOLUBLE RESIN

This application claims the benefit of PCT/KR2008/002055 filed on Apr. 11, 2008 and Korean Patent Application No. 10-2007-0035389 filed on Apr. 11, 2007, both of which are hereby incorporated herein by reference for all purposes in their entirety.

TECHNICAL FIELD

The present invention relates to a photosensitive resin composition that is excellent in chemical resistance and heat resistance, and results in no residues.

This application claims priority from Korea Patent Application No. 10-2007-0035389 filed on Apr. 11, 2007 in the KIPO, the disclosure of which is incorporated herein by reference in its entirety.

BACKGROUND ART

A photopolymerizable negative type of photosensitive resin composition has been used for various types of purposes such as a photoresist for manufacturing a color filter, an overcoat photoresist, a column spacer, and an insulating material having a light blocking property. In general, the photosensitive resin composition includes an alkali-soluble resin, a polymerizable compound having an ethylenically unsaturated bond, a photopolymerization initiator, a solvent and the like. The photosensitive resin composition may be prepared by the following method comprising: applying the photosensitive resin composition on a substrate to form a film, exposing a predetermined portion of the film with radiation of radioactive rays using a photomask and the like, and forming a pattern by removing non-exposed portions by development treatment.

In recent years, the application of LCDs (liquid crystal display) is expanded toward monitors for desktop computers, LCT TVs and the like as well as monitors for notebook computers, thus, a concentration of pigment is increased in a color filter photoresist and the pigment is finely dispersed in order to obtain a high quality color. Hence, the residues of the color filter photoresist are formed in a great amount. The most representative method of reducing the residue of the photoresist is to increase an acid value (AV) of a binder polymer that is included in an alkali soluble resin for manufacturing a photoresist or to reduce a molecular weight (MW) thereof. However, there is a limit to increase the acid value of the binder polymer due to the compatibility with other constitution components and the removal of the pattern during the development, and the reducing a molecular weight may reduce the chemical resistance, thus, this is undesirable.

Therefore, in the art, in order to produce a photoresist that has excellent physical properties, there was a need to obtain a novel material capable of being used as an alkali soluble resin and various studies have been made to develop the novel material.

DISCLOSURE

Technical Problem

Accordingly, the present invention has been made keeping in mind the above problems occurring in the prior arts, and an object of the present invention is to provide a photosensitive resin composition that has improved physical properties such as residue or not, chemical resistance, and heat resistance by using a polymer prepared by using a macromonomer as an alkali soluble resin.

Technical Solution

In order to accomplish the above object, the present invention provides a photosensitive resin composition that includes a polymer as an alkali soluble resin. The polymer is produced by using a method that includes 1) polymerizing one or more ethylenically unsaturated monomers selected from the group consisting of unsaturated carboxylic acid esters, aromatic vinyls, unsaturated ethers, N-vinyl tertiary amines, unsaturated imides, and maleic anhydride monomers by using a thermal polymerization initiator and a molecular weight controlling agent that is a thiol compound having a carboxylic acid structure at an end thereof according to a thermal polymerization process to obtain a product having an acidic group at an end thereof; 2) reacting the product having the acidic group at the end thereof that is obtained in the step 1 above and a methacryl or acryl monomer having an epoxy structure at an end thereof with each other to prepare a macromonomer; and 3) polymerizing the macromonomer that is obtained in the step 2 above and the monomer having the acidic group.

Advantageous Effects

In the present invention, the polymer obtained by using the macromonomer may be used as the alkali soluble resin, and the photosensitive resin composition that includes the alkali soluble resin may be prepared as a photoresist to improve physical properties such as residue or not, chemical resistance, and heat resistance.

BEST MODE

Since a polymer produced by using macromonomers according to the present invention has long branches at a side chain thereof unlike a typical linear polymer, the long branches of the polymer remove an organic pigment during the development. In addition, since the polymer has a branch that consists of rigid monomers, the polymer has a high glass transition temperature (Tg), thus improving chemical resistance, heat resistance and the like.

Hereinafter, a detailed description will be given of the present invention.

A photosensitive resin composition according to the present invention includes a polymer as an alkali soluble resin. The polymer is manufactured by a method that includes the following steps:

1) polymerizing one or more ethylenically unsaturated monomers selected from the group consisting of unsaturated carboxylic acid esters, aromatic vinyls, unsaturated ethers, N-vinyl tertiary amines, unsaturated imides, and maleic anhydride monomers by using a thermal polymerization initiator and a molecular weight controlling agent that is a thiol compound having a carboxylic acid structure at an end thereof according to a thermal polymerization process to obtain a product having an acidic group at an end thereof;

2) reacting the product having the acidic group at the end thereof that is obtained in the step 1 above and a methacryl or acryl monomer having an epoxy structure at an end thereof with each other to prepare a macromonomer; and 3) polymerizing the macromonomer obtained in the step 2 above and the monomer having the acidic group.

In respects to the method for producing the polymer according to the present invention, examples of the monomer that may be used during the step 1 above will be given.

Illustrative but non-limiting examples of the unsaturated carboxylic acid ester monomer include one or more that are selected from the group consisting of benzyl(meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl(meth)acrylate, isobornyl(meth)acrylate, ethylhexyl(meth)acrylate, 2-phenoxyethyl(meth)acrylate, tetrahydrofurfuryl(meth)acrylate, hydroxyethyl(meth)acrylate, 2-hydroxypropyl(meth)acrylate, 2-hydroxy-3-chloropropyl(meth)acrylate, 4-hydroxybutyl(meth)acrylate, acyloctyloxy-2-hydroxypropyl(meth)acrylate, glycerol(meth)acrylate, 2-methoxyethyl(meth)acrylate, 3-methoxybutyl(meth)acrylate, ethoxydiethylene glycol(meth)acrylate, methoxytriethyleneglycol(meth)acrylate, methoxytripropyleneglycol(meth)acrylate, poly(ethyleneglycol)methylether (meth)acrylate, phenoxydiethyleneglycol(meth)acrylate, p-nonylphenoxypolyethyleneglycol (meth)acrylate, p-nonylphenoxypolypropylene glycol(meth)acrylate, tetrafluoropropyl (meth)acrylate, 1,1,1,3,3,3-hexafluoroisopropyl(meth)acrylate, octafluoropentyl(meth)acrylate, heptadecafluorodecyl(meth)acrylate, tribromophenyl(meth)acrylate, methyl α-hydroxymethyl acrylate, ethyl α-hydroxymethyl acrylate, propyl α-hydroxymethyl acrylate, butyl α-hydroxymethyl acrylate, dicyclopentanyl(meth)acrylate, dicyclopentenyl (meth)acrylate, dicyclopentanyl oxyethyl(meth)acrylate, dicyclopentenyl oxyethyl(meth)acrylate and the like.

Illustrative but non-limiting examples of the aromatic vinyl monomers include one or more that are selected from the group consisting of styrene, α-methylstyrene, (o,m,p)-vinyltoluene, (o,m,p)-methoxystyrene, (o,m,p)-chlorostyrene and the like.

Illustrative but non-limiting examples of the unsaturated ether monomers include one or more that are selected from the group consisting of vinyl methyl ether, vinyl ethyl ether and the like. Illustrative but non-limiting examples of the N-vinyl tertiary amine monomers include one or more that are selected from the group consisting of N-vinyl pyrrolidone, N-vinyl carbazole, N-vinyl morpholine and the like.

Illustrative but non-limiting examples of the unsaturated imide monomers include one or more that are selected from the group consisting of N-phenylmaleimide, N-(4-chlorophenyl)maleimide, N-(4-hydroxyphenyl)maleimide, N-cyclohexylmaleimide and the like.

Illustrative but non-limiting examples of the maleic anhydride monomers include one or more that are selected from the group consisting of maleic anhydrides, methyl maleic anhydrides and the like.

It is preferable that the amount of the above-mentioned ethylenically unsaturated monomer used be less than 80 parts by weight based on 100 parts by weight of the alkali soluble resin. The reason for this is that if the amount is more than 80 parts by weight, the acryl or methacryl monomers may be reacted due to the high viscosity during the step 2 above.

In addition, illustrative but non-limiting examples of the thermal polymerization initiator used in the step 1 include one or more that are selected from the group consisting of 2,2'-azobisisobutyronitrile(AIBN), 2,2'-azobis-(2,4-dimethyl valeronitrile), 2,2'-azobis-(4-methoxy-2,4-dimethylvaleronitrile), benzoylperoxide, lauroyl peroxide, t-butyl peroxypivalate, 1,1'-bis-(bis-t-butylperoxy)cyclohexane and the like.

It is preferable that the used amount of the above thermal polymerization initiator be in the range of 1 to 10 parts by weight based on 100 parts by weight of the alkali soluble resin. The reason for this is that if the amount is less than 1 part by weight, the polymerization conversion efficiency may be low, and if the amount is more than 10 parts by weight, the thermal polymerization initiator may remain after the reaction.

In addition, specific examples of the molecular weight controlling agent that is the thiol compound having the carboxylic acid structure at the end thereof used in the step 1 above include one or more that are selected from the group consisting of 3-mercaptopropionic acid, 2-mercaptopropionic acid, 2-mercaptoacetic acid, 2-(5-chloro-2-cyano-3-methylphenyl)-2-mercaptoacetic acid, 2-mercapto-2-(naphthalene-7-yl)acetic acid, 2-(4-chloro-2-methylphenyl)-2-mercaptoacetic acid, 2-mercapto-4-methyl benzene propionic acid, 2-mercapto-2-(propylthio)acetic acid, 2-(isopropylthio)-2-mercaptoacetic acid, 2-mercapto-2-(butylthio)acetic acid, 2-mercapto-2-(methylthio)acetic acid, 2-mercapto-peragonic acid, 2-mercapto-3,4-dimethoxy hydro cinnamic acid, 2-mercapto-cyclopentanetridecanoic acid and the like, but are not included thereto.

The used amount of the molecular weight controlling agent that is the thiol compound having the carboxylic acid structure at the end thereof is in the range of preferably 0.2 to 10% by weight and more preferably 0.5 to 5% by weight based on the amount of the ethylenically unsaturated monomer. In the case of when the amount of the molecular weight controlling agent is less than 0.2% by weight, the molecular weight control effect is insignificant. In the case of when the amount is more than 10% by weight, since the molecular weight of the formed polymer is very small, the physical strength of the coat film required in the photoresist cannot be obtained and a double body of a CTA (Chain Transfer Agent) may be generated as an impurity.

In an embodiment of the present invention, the macromonomer that is obtained in the step 2 may be a compound represented by the following Formula 1.

[Formula 1]

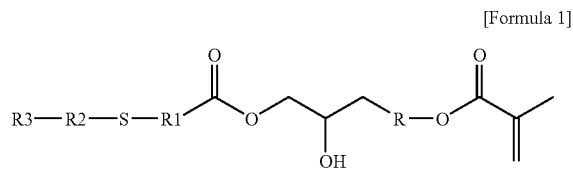

In the above Formula 1,

R is methylene or cyclohexylene,

R1 is any one that is selected from the group consisting of alkylene that is unsubstituted or substituted with $C_1$ to $C_{12}$ cyclohexyl; $C_1$ to $C_4$ alkyl thio; phenylene that is unsubstituted or substituted with any one that is selected from the group consisting of halogen, a cyano group, a $C_1$ to $C_6$ alkyl group, and $C_1$ to $C_6$ alkoxy phenylene; and naphthalene, R2 is an organic divalent group generated by polymerizing one or more that are selected from the group consisting of unsaturated carboxylic acid ester, aromatic vinyl, unsaturated ether, N-vinyl tertiary amine, unsaturated imide, and maleic anhydride monomers, and R3 may be various types of substances due to the radical polymerization characteristics, and a group that results from the thermal polymerization initiator, a hydrogen atom that results from a chain transfer reaction, or a disproportionation reaction and the like, a polymer that results from a combination reaction or the like.

Examples of the group that results from the thermal polymerization initiator may include an iso butyl group, a 2,4-dimethyl valeronitrile group, a 4-methoxy-2,4-dimethyl valeronitrile group, a benzene group and the like.

Since the polymer that results from the combination reaction may be formed by using various types of processes, the type of process cannot be specifically limited. The polymer may be generated by polymerizing one or more that are selected from the group consisting of unsaturated carboxylic acid esters, aromatic vinyl, unsaturated ether, N-vinyl tertiary amine, unsaturated imide, and maleic anhydride monomers.

For example, the macromonomer may be prepared according to the following Reaction Equation.

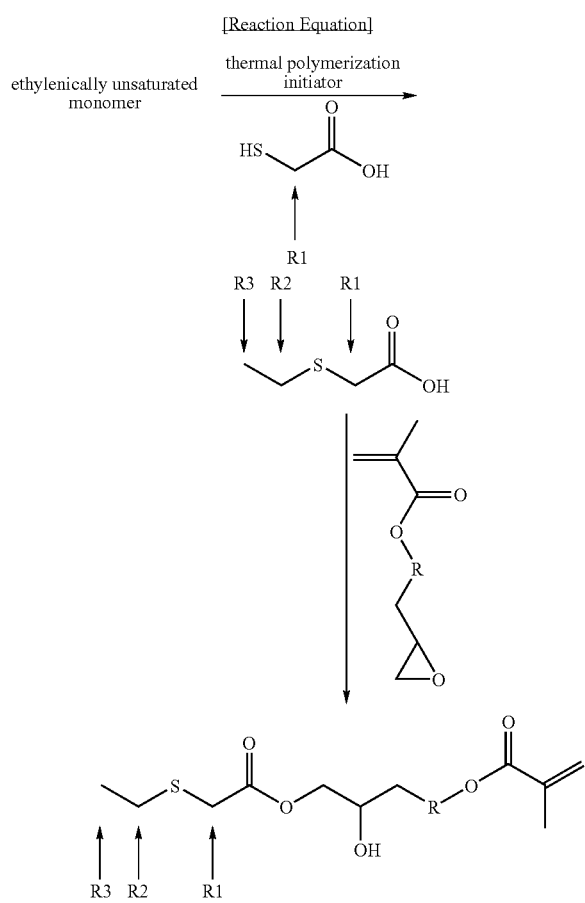

The above reaction relates to a reaction in which the ethylenically unsaturated monomer, the thermal polymerization initiator, the thiol compound having the carboxylic acid structure at an end thereof, and the methacryl or acryl monomer having the epoxy structure at an end thereof are reacted with each other to prepare the macromonomer. Specifically, as shown in the above Reaction Equation, the ethylenically unsaturated monomer, the thermal polymerization initiator, and the thiol compound having the carboxylic acid structure at an end thereof may be polymerized to generate a compound having an acidic group at an end thereof, and the compound having the acidic group at an end thereof may be reacted with the methacryl or acryl monomer having the epoxy structure at an end thereof to prepare the macromonomer. The macromonomer thusly prepared can be subjected to a radical polymerization, thus being polymerized with the monomer having the acidic group to form a polymer having a long chain. The formed polymer may be used as an alkali soluble resin in a photosensitive resin composition.

In respects to the method for producing the polymer, during the polymerization of the steps 1 and 3, it is preferable that the polymerization temperature and the polymerization time be determined in consideration of a half life of the used thermal polymerization initiator according to the temperature. For example, when 2,2'-azobisisobutyronitrile (AIBN) is used as the thermal polymerization initiator, since the half life is 4.8 hours at 70° C., it is preferable that the polymerization time be 6 hours or more. In general, it is preferable that the polymerization temperature be in the range of 50 to 150° C. and the polymerization time be in the range of 30 min to 48 hours. In addition, it is preferable that the polymerization be performed under a nitrogen atmosphere.

Specifically, in the present invention, examples of the methacryl or acryl monomer having the epoxy structure at an end thereof used in the step 2 include one or more that are selected from the group consisting of allyl glycidyl ether, glycidyl(meth)acrylate, 3,4-epoxycyclohexylmethyl(meth)acrylate and the like, but are not limited thereto.

In addition, the used amount of the methacryl or acryl monomer having the epoxy structure at an end thereof is preferably in the range of 1 to 3 equivalents and more preferably in range of 1.1 to 1.5 equivalents based on the acidic group that is contained in the product obtained in the step 1. In the case of when the amount is less than 1 equivalent, the acidic group at the end of the product in the step 1 may be remained without undergoing any reaction. In the case of when the amount is more than 3 equivalents, the epoxy compound may be remained without undergoing any reaction, thus affecting the acidic group monomer used during the production of the polymer by using the macromonomer.

In the present invention, in the step 3, the macromonomer obtained in the step 2 and the monomer having the acidic group may be polymerized to polymerize the alkali soluble resin. In connection with this, the macromonomer and the monomer having the acidic group may be polymerized by using the radical polymerization method.

The radical polymerization initiator capable of being used in the radical polymerization may be an initiator that is known in the art, and illustrative but non-limiting examples of the radical polymerization initiator include 2,2'-azobisisobutyronitrile (AIBN), 2,2'-azobis-(2,4-dimethyl valeronitrile), 2,2'-azobis-(4-methoxy-2,4-dimethylvaleronitrile), benzoylperoxide, lauroyl peroxide, t-butyl peroxypivalate, 1,1'-bis-(bis-t-butylperoxy)cyclohexane and the like. The radical polymerization initiator may be the same as the thermal polymerization initiator.

Examples of the monomer having the acidic group used in the step 3 include one or more that are selected from the group consisting of (meth)acrylic acid, crotonic acid, itaconic acid, maleic acid, fumaric acid, monomethyl maleic acid, isoprenesulfonic acid, styrene sulfonic acid, 5-norbornene-2-carboxylic acid, mono-2-((meth)acryloyloxy)ethyl phthalate, mono-2-((meth)acryloyloxy)ethyl succinate, ω-carboxy-polycaprolactone mono(meth)acrylate, but are not limited thereto.

In addition, in the polymerization of the step 3, it is preferable that the monomer having the unsaturated ethylene group is added as a comonomer to polymerize the alkali soluble resin. Examples of the monomer having the unsaturated ethylene group include unsaturated carboxylic acid ester monomers, aromatic vinyl monomers, unsaturated ether monomers, unsaturated imide monomers, N-vinyl tertiary amines, maleic anhydride monomers and the like.

According to an embodiment in respects to this, in order to obtain the alkali soluble resin, the monomer having the acidic group, the macromonomer, and the monomer having the unsaturated ethylene group may be mixed with a polymerization solvent, heated at a predetermined temperature, and subjected to nitrogen purging to remove oxygen, and the radical polymerization initiator and the chain transfer agent (CIA) may be added thereto while the polymerization temperature is maintained.

In connection with this, based on 100 parts by weight of the total monomers, the macromonomer prepared in the step 2 may be contained in an amount in the range of 5 to 60 parts by weight, the monomer having the acidic group may be contained in an amount in the range of 5 to 60 parts by weight, and the monomer having the unsaturated ethylene group may be contained in an amount in the range of 0 to 90 parts by weight.

In addition, the photosensitive resin composition that includes the polymer prepared by using the macromonomer according to the present invention as the alkali soluble resin may further include one or more that are selected from the group consisting of a polymerizable compound having an ethylenically unsaturated bond, a photopolymerization initiator, a solvent and the like.

Specifically, it is preferable that based on 100 parts by weight of the photosensitive resin composition, the photosensitive resin composition includes 1) 1 to 20 parts by weight of an alkali soluble resin;
2) 0.5 to 30 parts by weight of a polymerizable compound having an ethylenically unsaturated bond;
3) 0.1 to 5 parts by weight of a photopolymerization initiator; and
4) 10 to 95 parts by weight of a solvent.

Illustrative but non-limiting examples of the polymerizable compound having the ethylenically unsaturated bond include compounds obtained by esterifying polyhydric alcohols, such as ethylene glycol di(meth)acrylate, polyethylene glycol di(meth)acrylate including 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethyl phthalic acid, propylene glycol di(meth)acrylate including 2 to 14 propylene groups, dipentaerythritol penta(meth)acrylate, and dipentaerythritol hexa(meth)acrylate, with α,β-unsaturated carboxylic acids; compounds obtained by adding a (meth) acrylic acid to a compound containing glycidyl group, such as trimethylolpropane triglycidyletheracrylic acid adduct and bisphenol A diglycidyletheracrylic acid adduct; phthalic acid diester of β-hydroxyethyl(meth)acrylate, ester compounds obtained from hydroxyl group such as a toluene diisocyanate adduct of β-hydroxyethyl (meth)acrylate or a compound having an ethylenically unsaturated bond and a polyhydroxycarboxylic acid, or an adduct with polyisocyanate; and (meth) acrylic acid alkyl esters, such as methyl(meth)acrylate, ethyl (meth)acrylate, butyl(meth)acrylate, and ethylhexyl(meth) acrylate; and 9,9'-bis[4-(2-acryloyloxyethoxy)phenyl] fluorene. However, the polymerizable compound is not limited thereto, and materials that are known in the art may be used as the polymerizable compound. In addition, silica dispersed substances may be used to the compound if necessary, for example, Nanocryl XP series (0596, 1045, and 21/1364) and Nanopox XP series (0516 and 0525) that are manufactured by Hanse Chemie, Co., Ltd. may be used.

Illustrative but non-limiting examples of the photopolymerization initiator include triazine compounds, such as 2,4-trichloromethyl-(4'-methoxyphenyl)-6-triazine, 2,4-trichloromethyl-(4'-methoxystyryl)-6-triazine, 2,4-trichloromethyl-(pyflonyl)-6-triazine, 2,4-trichloromethyl-(3',4'-dimethoxyphenyl)-6-triazine, and 3-{4-[2,4-bis(trichloromethyl)-s-triazine-6-yl]phenylthio}propanoic acid; biimidazole compounds, such as 2,2'-bis(2-chlorophenyl)-4,4',5,5'-tetraphenyl biimidazole, 2,2'-bis(2,3-dichlorophenyl)-4,4',5,5'-tetraphenylbiimidazole; acetophenone compounds (Irgacure-369), such as 2-hydroxy-2-methyl-1-phenylpropane-1-on, 1-(4-isopropylphenyl)-2-hydroxy-2-methylpropane-1-on, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propane-1-on (Irgacure-907), and 2-benzyl-2-dimethylamino-1-(4-morpholinophenyl)-butane-1-on; O-acyloxime compounds, such as Irgacure OXE 01 and Irgacure OXE 02 manufactured by Ciba Geigy, Co., Ltd., benzophenone compounds, such as 4,4'-bis(dimethylamino)benzophenone and 4,4'-bis(diethylamino)benzophenone; thioxanthone compounds, such as 2,4-diethyl thioxanthone, 2-chloro thioxanthone, isopropyl thioxanthone, and diisopropyl thioxanthone; phosphine oxide compounds, such as 2,4,6-trimethylbenzoyl diphenylphosphine oxide, bis(2,6-dimethoxybenzoyl)-2,4,4-trimethylpentyl phosphine oxide, and bis(2,6-dichlorobenzoyl) propyl phosphine oxide; and coumarin compounds, such as 3,3'-carbonylvinyl-7-(diethylamino)coumarin, 3-(2-benzothiazolyl)-7-(diethylamino) coumarin, 3-benzoyl-7-(diethylamino)coumarin, 3-benzoyl-7-methoxy-coumarin, and 10,10'-carbonylbis[1,1,7,7-tetramethyl-2,3,6,7-tetrahydro-1H,5H,11H—Cl]-benzopyrano[6,7,8-ij]-quinolizin-11'-one.

Illustrative but non-limiting examples of the solvent include methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxypropanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, or a mixture thereof.

The photosensitive resin composition according to the present invention may further include one or more additives selected from the group consisting of a photo-sensitizer, a coloring agent, a curing accelerator, a thermal polymerization inhibitor, a plasticizer, an adhesion accelerator, a filler, and a surfactant if necessary.

One or more pigments, dyes, or mixtures thereof may be used as the coloring agent. Specific examples of the black pigment may include carbon blacks, black leads, meth 1 oxides such as titanium black and the like. Examples of the carbon blacks include SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS, and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B (Mitsubishi Chemical Co. Ltd.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX- 35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Colombia Carbon Co., Ltd.), and a mixture thereof.

In addition, examples of the coloring agent for providing the color include CARMINE 6B (C.I. 12490), PHTHALOCYANINE GREEN (C.I. 74260), PHTHALOCYANINE BLUE (C.I. 74160), PERYLENE BLACK (BASF K0084. K0086), CYANINE BLACK, LIONOL YELLOW (C.I. 21090), LIONOL YELLOW GRO (C.I. 21090), BENZIDINE YELLOW 4T-564D, VICTORIA PURE BLUE (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7 and 36; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; C.I. PIGMENT VIOLET 15, 19, 23, 29, 32, and 37 and the like. Additionally, a white pigment, a fluorescent pigment and the like may be used as the coloring agent.

Examples of the above curing accelerator may include one or more compounds selected from the group consisting of 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate). However, the curing accelerator is not limited thereto, and materials that are known in the art may be used as the curing accelerator.
Examples of the above thermal polymerization inhibitor may include one or more selected from the group consisting of p-anisole, hydroquinone, pyrocatechol, t-butylcatechol, N-nitrosophenylhydroxyamine ammonium salt, N-nitrosophenylhydroxyamine aluminum salt, and phenothiazine. However, the thermal polymerization inhibitor is not limited thereto, and materials that are known in the art may be used as the thermal polymerization inhibitor.
All of the compounds that may be included in the photoresist resin composition in the related art may be also used as the plasticizer, the adhesion promoter, the filler, and the surfactant.

The photosensitive resin composition according to the present invention may be used for a color filter photoresist, an overcoat photoresist, a column spacer, an insulating material or the like.

A better understanding of the present invention may be obtained in light of the following Examples which are set forth to illustrate, but are not to be construed to limit the present invention.

MODE FOR INVENTION

Synthetic Example 1

Synthesis of the Macromonomer 58 g of N-phenyl maleimide, 42 g of styrene, 6 g of the 3-mercaptopropionic acid, and 300 g of propylene glycol monomethyl ether acetate (PGMEA) as a solvent were mixed with each other under a nitrogen atmosphere by using the mechanical stirrer for 30 min. Under a nitrogen atmosphere, the temperature of the reactor was increased to 70° C. When the temperature of the mixture reached 70° C., 2.0 g of AIBN (Azobisisobutyronitrile) as a thermal polymerization initiator was added thereto and then agitated for 6 hours. 0.07 g of MEHQ as a thermal polymerization inhibitor and 0.2 g of triphenylphosphine were added thereto. The temperature of the reactor was increased to 90° C., and the agitation was performed for 30 min. 8 g of glycidyl methacrylate was added, and the temperature of the reactor was increased to 120° C. and the agitation was performed for 24 hours while an air atmosphere was maintained (Mw: 4,700, AV: 1.09).

Synthetic Example 2

Synthesis of the Known Alkali Soluble Resin 9 g of N-phenyl maleimide, 11 g of styrene, 53 g of benzyl methacrylate, 28 g of the methacrylic acid, 2 g of the 3-mercaptopropionic acid, and 300 g of propylene glycol monomethyl ether acetate (PGMEA) as the solvent were mixed with each other under a nitrogen atmosphere by using the mechanical stirrer for 30 min. Under a nitrogen atmosphere, the temperature of the reactor was increased to 70° C. When the temperature of the mixture reached 70° C., 2.0 g of AIBN (Azobisisobutyronitrile) as the thermal polymerization initiator was added thereto and then agitated for 6 hours (Mw: 10,000, AV: 107).

Synthetic Example 3

Synthesis of the Known Alkali Soluble Resin 75 g of benzyl methacrylate, 25 g of the methacrylic acid, 3.2 g of the 3-mercaptopropionic acid, and 300 g of PGMEA as the solvent were mixed with each other under a nitrogen atmosphere by using the mechanical stirrer for 30 min. Under a nitrogen atmosphere, the temperature of the reactor was increased to 70° C. When the temperature of the mixture reached 70° C., 2.0 g of AIBN (Azobisisobutyronitrile) as the thermal polymerization initiator was added thereto and then agitated for 6 hours. The temperature of the reactor was increased to 90° C., and 0.2 g of triphenylphosphine was added thereto. 0.07 g of MEHQ as the thermal polymerization inhibitor was added thereto, the agitation was performed for 30 min. Next, 10 g of glycidyl methacrylate was added, and the temperature of the reactor was increased to 110° C. and the agitation was performed for 20 hours while an air atmosphere was maintained (MW: 10,000, AV: 110).

Synthetic Example 4

The Alkali Soluble Resin According to the Present Invention 45 g of benzyl methacrylate, 15 g of the methacrylic acid, 40 g of the macromonomer that was obtained in Synthetic Example 1, 3.5 g of the 3-mercaptopropionic acid, and 300 g of PGMEA as the solvent were mixed with each other under a nitrogen atmosphere by using the mechanical stirrer for 30 min. Under a nitrogen atmosphere, the temperature of the reactor was increased to 70° C. When the temperature of the mixture reached 70° C., 2.0 g of AIBN as the thermal polymerization initiator was added thereto and then agitated for 6 hours (MW: 11,000, AV: 105).

Synthetic Example 5

The Alkali Soluble Resin According to the Present Invention 42 g of benzyl methacrylate, 22 g of the methacrylic acid, 36 g of the macromonomer that was obtained in Synthetic Example 1, 3.8 g of the 3-mercaptopropionic acid, and 300 g of PGMEA as the solvent were mixed with each other under a nitrogen atmosphere by using the mechanical stirrer for 30 min. Under a nitrogen atmosphere, the temperature of the reactor was increased to 70° C. When the temperature of the mixture reached 70%, 2.0 g of AIBN as the thermal polymerization initiator was added thereto and then agitated for 6 hours. Next, the temperature of the reactor was increased to 90° C., and 0.2 g of triphenylphosphine was added thereto. 0.07 g of MEHQ that was the thermal polymerization inhibitor was added thereto, the agitation was performed for 30 min. Next, 7 g of glycidyl methacrylate was added, and the temperature of the reactor was increased to 110° C. and the agitation was performed for 20 hours while an air atmosphere was maintained (MW: 11,500, AV: 110).

Example 1

50 g of 15% dispersion solution of C.I. Pigment Red 254 as the pigment among components of the photosensitive resin composition, 5 g of the alkali soluble resin as prepared in Synthetic Example 4, 3 g of dipentaerythritol hexaacrylate that was the polymerizable compound, 2 g of the photopolymerization initiator Irgacure-369, and 40 g of PGMEA as the organic solvent were mixed with each other for 3 hours to prepare the photosensitive resin composition.

Example 2

65 g of 15% dispersion solution of C.I. Pigment Green 36 as the pigment among components of the photosensitive resin composition, 5 g of the alkali soluble resin that was prepared in Synthetic Example 4, 6 g of dipentaerythritol hexaacrylate as the polymerizable compound, 2 g of the photopolymerization initiator Irgacure-369, 0.2 g of 4,4'-diethyl aminobenzophenone, and 40 g of PGMEA as the organic solvent were mixed with each other for 3 hours to prepare the photosensitive resin composition.

Example 3

40 g of 15% dispersion solution of C.I. Pigment Blue 15:4 as the pigment among components of the photosensitive resin composition, 8 g of the alkali soluble resin that was prepared in Synthetic Example 5, 10 g of dipentaerythritol hexaacrylate as the polymerizable compound, 2 g of the photopolymerization initiator Irgacure-907, and 40 g of PGMEA that was the organic solvent were mixed with each other for 3 hours to prepare the photosensitive resin composition.

Example 4

35 g of 25% dispersion solution of carbon black among components of the photosensitive resin composition, 3.5 g of the alkali soluble resin that was prepared in Synthetic Example 4, 3.5 g of dipentaerythritol hexaacrylate as the polymerizable compound, 2.5 g of the photopolymerization initiator Irgacure-369, 1 g of the 3-{4-[2,4-bis(trichloromethyl)-s-triazine-6-yl]phenylthio}propanic acid, 0.5 g of 4,4'-diethyl aminobenzophenone, and 40 g of PGMEA as the organic solvent were mixed with each other for 3 hours to prepare the photosensitive resin composition.

Comparative Example 1

The same process as Example 1 was performed to prepare the photosensitive resin composition, except that the alkali soluble resin prepared in Synthetic Example 2 was used.

Comparative Example 2

The same process as Example 2 was performed to prepare the photosensitive resin composition, except that the alkali soluble resin prepared in Synthetic Example 2 was used.

Comparative Example 3

The same process as Example 3 was performed to prepare the photosensitive resin composition, except that the alkali soluble resin prepared in Synthetic Example 3 was used.

Experimental Example 1

Evaluation of Physical Properties of the Photosensitive Resin Composition

In order to evaluate the pattern sharpness, the residue or not, the chemical resistance (acid resistance and solvent resistance), and the heat resistance of the photosensitive resin composition that was prepared according to the present invention, the following test was performed.

The compositions that were prepared in Examples 1 to 4 were used as the photosensitive resin composition, and the compositions that were prepared in Comparative Examples 1 to 3 were used as the control group.

The photosensitive resin composition solutions were applied on glass by using spin coating and the prebaking was performed at about 100° C. for 2 min to form the films. The formed films were exposed to energy having the intensity of 100 or 200 mJ/cm$^2$ under the high-pressure mercury lamp by using the photomask, and the patterns were developed by using the KOH alkali aqueous solution having the pH in the range of 11.3 to 11.7 every hour and then washed by using deionized water. Next, after the postbaking treatment was performed at 200° C. for about 40 min, the pattern sharpness, the residue or not, the chemical resistance (acid resistance and solvent resistance) and the heat resistance thereof were evaluated by using the following methods, and the results are described in Table 1.

pattern sharpness and residue or not: The glass substrate on which the coat film was formed was observed by using the optical microscope.

Acid resistance: After the glass substrate on which the coat film was formed was dipped in an aqueous solution having a weight ratio of $HCl/FeCl_3=1/1$ at 40° C. for 10 min, the change in the appearance of the coat film was observed to evaluate the acid resistance. In connection with this, no change in the appearance meant that the acid resistance was fair (O), slight change in the appearance meant that the acid resistance was middle (Δ), and the stripping or decoloration of the films meant that the acid resistance was poor (X).

Solvent resistance: After the glass substrate on which the coat film was formed was dipped in an NMP solution at 40° C. for 10 min, the change in the appearance of the coat film was observed to evaluate the solvent resistance. In connection with this, no change in the appearance meant that the solvent resistance was fair (O), slight change in the appearance meant that the solvent resistance was middle (Δ), and the stripping or decoloration of the films meant that the solvent resistance was poor (X).

Heat resistance: The glass substrates on which the coat film was formed were subjected to heat treatment in a clean oven at 250° C. for 1 hour, and the reduction ratio of thickness after the heat treatment to thickness before the heat treatment was checked.

The results are described in the following Table 1.

TABLE 1

| | Pattern sharpness | Residue or not | Acid resistance | Solvent resistance | Heat resistance (change in thickness) |
|---|---|---|---|---|---|
| Example 1 | O | None | O | O | 4.5% |
| Example 2 | O | None | O | O | 4.2% |
| Example 3 | Δ | None | O | O | 4.0% |
| Example 4 | O | None | O | O | 4.5% |
| Comparative Example 1 | O | Weak | X | X | 5.8% |
| Comparative Example 2 | O | Weak | X | X | 5.5% |
| Comparative Example 3 | Δ | Middle | Δ | Δ | 5.5% |

From the above Table 1, it can be seen that the photosensitive resin compositions of Examples 1 to 4 including the alkali soluble resin prepared by using the macromonomer according to the present invention are superior in pattern sharpness, acid resistance, solvent resistance and heat resistance, and result in no residues as compared to the compositions of Comparative Examples 1 to 3 using known monomers.

Thereby, it can be confirmed that the photosensitive resin composition according to the present invention includes the alkali soluble resin prepared by using the macromonomer, to satisfy all the required chemical resistance and heat resistance, and does not leave any residue.

The invention claimed is:

1. A photosensitive resin composition that includes a polymer as an alkali soluble resin, the polymer being produced by using a method comprising:
   1) polymerizing ethylenically unsaturated monomers including an aromatic vinyl and an unsaturated imide by using a thermal polymerization initiator and a molecular weight controlling agent that is a thiol compound having a carboxylic acid structure at an end thereof according to a thermal polymerization process to obtain a product having an acidic group at an end thereof;
   2) reacting the product having the acidic group at the end thereof that is obtained in step 1 above and a methacryl or acryl monomer having an epoxy structure at an end thereof with each other to prepare a macromonomer; and
   3) polymerizing the macromonomer that is obtained in step 2 above and a monomer having an acidic group.

2. The photosensitive resin composition as set forth in claim 1, further comprising a monomer having an unsaturated ethylene group as a comonomer during the polymerization of step 3 above.

3. The photosensitive resin composition as set forth in claim 2, wherein the monomer having the unsaturated ethylene group is one selected from the group consisting of unsaturated carboxylic acid ester monomer, aromatic vinyl monomer, unsaturated ether monomer, unsaturated imide monomer, N-vinyl tertiary amine monomer, maleic anhydride monomer, and combinations thereof.

4. The photosensitive resin composition as set forth in claim 1, wherein in step 1, the aromatic vinyl monomer is one selected from the group consisting of styrene, .alpha.-methylstyrene, (o,m,p)-vinyltoluene, (o,m,p)-methoxystyrene, (o,m,p)-chlorostyrene, and combinations thereof.

5. The photosensitive resin composition as set forth in claim 1, wherein in step 1, the unsaturated imide monomer is one selected from the group consisting of N-phenylmaleimide, N-(4-chlorophenyl)maleimide, N-(4-hydroxyphenyl)maleimide, N-cyclohexylmaleimide, and combinations thereof.

6. The photosensitive resin composition as set forth in claim 1, wherein in step 1, the thermal polymerization initiator is one selected from the group consisting of 2,2'-azobisisobutyronitrile (AIBN), 2,2'-azobis-(2,4-dimethyl valeronitrile), 2,2'-azobis-(4-methoxy-2,4-dimethylvaleronitrile), benzoylperoxide, lauroyl peroxide, t-butyl peroxypivalate, 1,1'-bis-(bis-t-butylperoxy)cyclohexane, and combinations thereof.

7. The photosensitive resin composition as set forth in claim 1, wherein in step 1, the molecular weight controlling agent that is a thiol compound having a carboxylic acid structure at an end thereof is one selected from the group consisting of 3-mercaptopropionic acid, 2-mercaptopropionic acid, 2-mercaptoacetic acid, 2-(5-chloro-2-cyano-3-methylphenyl)-2-mercaptoacetic acid, 2-mercapto-2-(naphthalene-7-yl)acetic acid, 2-(4-chloro-2-methylphenyl)-2-mercaptoacetic acid, 2-mercapto-4-methyl benzene propionic acid, 2-mercapto-2-(propylthio)acetic acid, 2-(isopropylthio)-2-mercaptoacetic acid, 2-mercapto-2-(butylthio)acetic acid, 2-mercapto-2-(methylthio)acetic acid, 2-mercapto-peragonic acid, 2-mercapto-3,4-dimethoxy hydro cinnamic acid, 2-mercapto-cyclopentanetridecanoic acid, and combinations thereof.

8. The photosensitive resin composition as set forth in claim 1, wherein in step 2, the methacryl or acryl monomer having an epoxy structure at an end thereof is one selected from the group consisting of glycidyl(meth)acrylate, 3,4-epoxycyclohexylmethyl(meth)acrylate, and combinations thereof.

9. The photosensitive resin composition as set forth in claim 1, wherein the macromonomer comprises a compound that is represented by the following Formula 1:

[Formula 1]

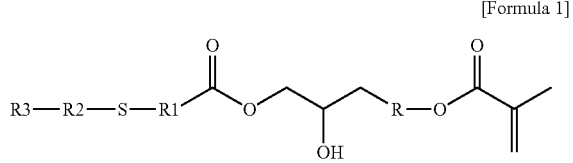

wherein R is methylene or cyclohexylene,
R1 is any one that is selected from the group consisting of alkylene that is unsubstituted or substituted with C₁ to $C_{12}$ cyclohexyl; $C_1$ to $C_4$ alkyl thio; phenylene that is unsubstituted or substituted with any one that is selected from the group consisting of halogen, a cyano group, a $C_1$ to $C_6$ alkyl group, and $C_1$ to $C_6$ alkoxy phenylene; and naphthalene, R2 is an organic divalent group that is generated by polymerizing an aromatic vinyl or an unsaturated imide, and R3 is selected from the group consisting of a group that results from the thermal polymerization initiator, a hydrogen atom that results from a chain transfer reaction, or a disproportionation reaction, and a polymer that results from a combination reaction.

10. The photosensitive resin composition as set forth in claim 1, wherein in step 3, the monomer having an acidic group is one selected from the group consisting of (meth)acrylic acid, crotonic acid, itaconic acid, maleic acid, fumaric acid, monomethyl maleic acid, isoprenesulfonic acid, styrene sulfonic acid, 5-norbornene-2-carboxylic acid, mono-2-((meth)acryloyloxy)ethyl phthalate, mono-2-((meth)acryloyloxy)ethyl succinate, ω-carboxypolycaprolactone mono (meth)acrylate, and combinations thereof.

11. The photosensitive resin composition as set forth in claim 1, further comprising one or more selected from the group consisting of a polymerizable compound having an ethylenically unsaturated bond, a photopolymerization initiator, and a solvent.

12. The photosensitive resin composition as set forth in claim 11, wherein based on 100 parts by weight of the photosensitive resin composition, the photosensitive resin composition comprises:
   1) 1 to 20 parts by weight of an alkali soluble resin;
   2) 0.5 to 30 parts by weight of a polymerizable compound having an ethylenically unsaturated bond;
   3) 0.1 to 5 parts by weight of a photopolymerization initiator; and
   4) 10 to 95 parts by weight of a solvent.

* * * * *